United States Patent
Hartwell et al.

(10) Patent No.: US 6,955,976 B2
(45) Date of Patent: Oct. 18, 2005

(54) METHOD FOR DICING WAFER STACKS TO PROVIDE ACCESS TO INTERIOR STRUCTURES

(75) Inventors: Peter G. Hartwell, Sunnyvale, CA (US); David Horsley, Berkeley, CA (US); Storrs T. Hoen, Brisbane, CA (US); Jonah A. Harley, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 234 days.

(21) Appl. No.: 10/066,213

(22) Filed: Feb. 1, 2002

(65) Prior Publication Data

US 2003/0148553 A1 Aug. 7, 2003

(51) Int. Cl.$^7$ .............................................. H01L 21/30
(52) U.S. Cl. ...................... 438/456; 438/113; 438/458; 438/460

(58) Field of Search .................................. 438/113, 456, 438/458, 460, FOR 386

(56) References Cited

U.S. PATENT DOCUMENTS 6,436,793 B1 * 8/2002 Kneezel et al. ............. 438/458
6,555,901 B1 * 4/2003 Yoshihara et al. .......... 257/684

* cited by examiner

*Primary Examiner*—George Fourson
*Assistant Examiner*—Julio J. Maldonado (57) ABSTRACT

Methods for dicing wafer stacks are provided. Preferably, the method includes the steps of: (1) providing a wafer stack having a first wafer and a second wafer; (2) exposing a portion of the first wafer by removing a portion of the second wafer; and (3) dicing the exposed portion of the first wafer such that a first die assembly is at least partially separated from the wafer stack. Wafer stacks and die assemblies also are provided.

7 Claims, 8 Drawing Sheets

METHOD FOR DICING WAFER STACKS TO PROVIDE ACCESS TO INTERIOR STRUCTURES

BACKGROUND OF THE INVENTION

1. Field of the Invention

The present invention generally relates to semiconductor fabrication. More specifically, the present invention relates to systems and methods pertaining to wafer stacks that involve dicing the wafer stacks in order to provide access to interior structures and/or components of the wafer stacks.

2. Description of the Related Art

Figure 1:
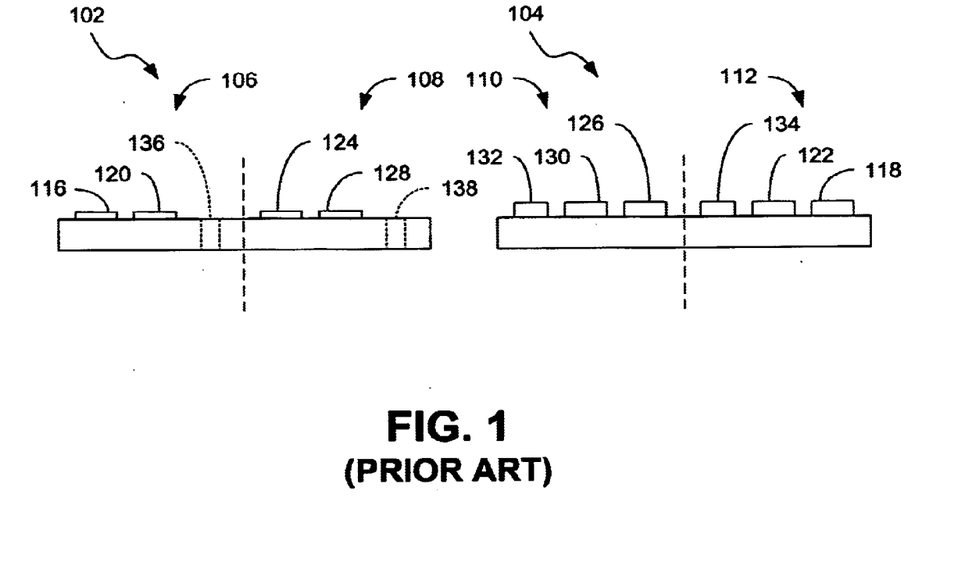
FIG. 1 is a schematic view of representative wafers that may be utilized to form a prior art wafer stack.
Figure 2:
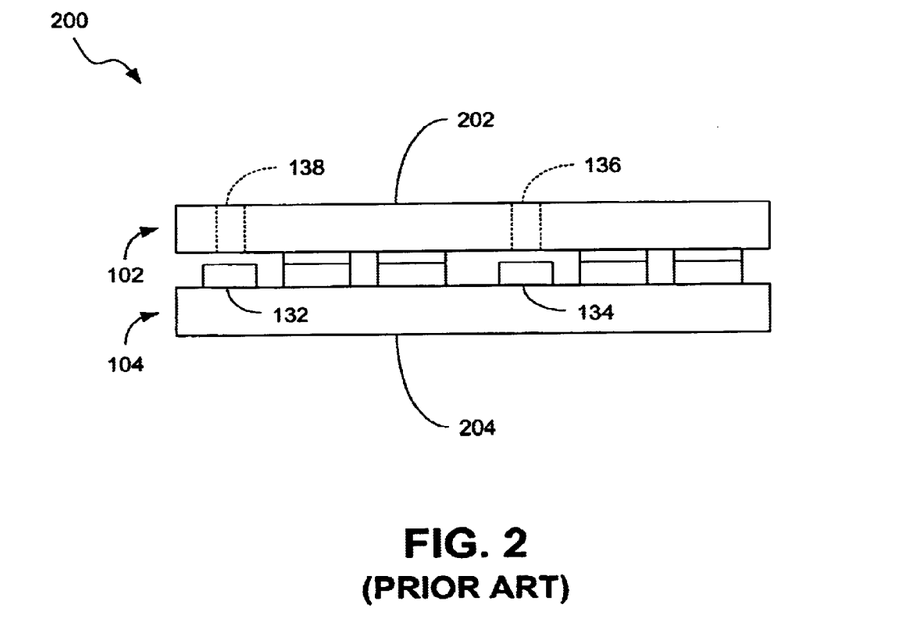
FIG. 2 is a schematic diagram depicting a representative prior art wafer stack formed from the wafers of FIG. 1.

Several semi-conductor device fabrication techniques involve the use of multiple semi-conductor wafers that are bonded to each other to form a wafer stack. In one such technique, for example, components and/or circuitry ("processing") is provided on the upper surface of a first wafer and on the upper surface of a second wafer. The first wafer is then inverted and aligned with the second wafer so that corresponding processing of the wafers are aligned with each other. The wafers are engaged with each other and bonded together so that the corresponding processing properly engage each other. For example, the engaged processing may electrically communicate and/or mechanically engage each other. FIGS. 1 and 2 schematically depict this technique.

In FIG. 1, representative portions of a first wafer 102 and a second wafer 104 are depicted. Wafer 102 is configured to provide multiple dies, e.g., die 106 and die 108. Likewise, wafer 104 is configured to provide multiple dies, e.g., die 110 and die 112. Each die can incorporate one or more features and/or components that are configured to engage one or more corresponding features and/or components of a die of the other wafer. For example, component 116 is configured to engage component 118, component 120 is configured to engage component 122, component 124 is configured to engage component 126, and component 128 is configured to engage component 130. Also depicted in FIG. 1 are pads 132 and 134, which are provided so as to facilitate communication of signals on and off of the wafers. In order to facilitate communication of signals using the pads, vias 136 and 138 are provided in wafer 102.

In FIG. 2, wafers 102 and 104 are shown bonded together to form a wafer stack 200. Wafers 102 and 104 typically are bonded together by a conventional technique, such as thermal compression, eutectic, and/or anodic bonding. As shown in FIG. 2, once the wafers are bonded together, the processing of the wafers generally are disposed between substrates 202 and 204 of the wafers. Note that via 138 is aligned with pad 132, and via 136 is aligned with pad 134.

Figure 3:
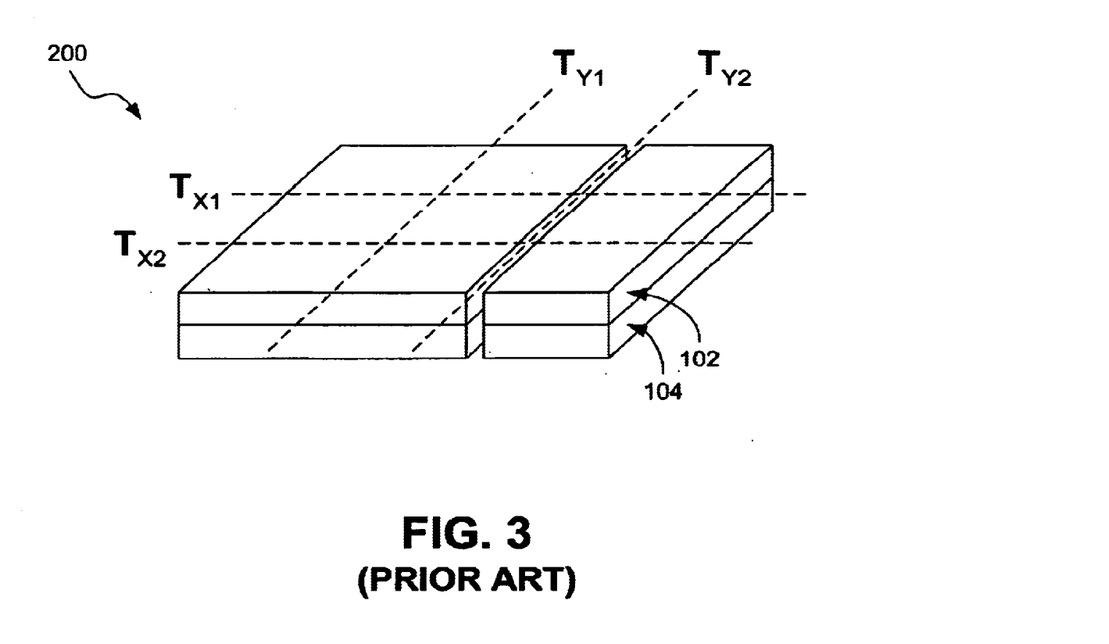
FIG. 3 is a schematic diagram depicting a representative prior art wafer-stack dicing technique.

In order to separate die assemblies from the wafer stack, various through-cuts typically are made through the stack. As used herein, a "through-cut" refers to dicing of a portion of the wafer stack so as to separate the wafer stack at the dicing location. A representative through-cut $T_{Y2}$ is depicted in FIG. 3. Also depicted in FIG. 3 are various other cut locations that are designated for receiving through-cuts. These locations are designated $T_{Y1}$, $T_{X1}$, and $T_{X2}$. As is known, a through-cut is a cut made through the material of the stack that enables the stack to be separated at the cut location. Thus, through-cut $T_{Y2}$ may be cut through the stack from one side to the other side or may be cut through a sufficient depth of the material so that the stack can be separated, such as by fracturing the material remaining at the cut location.

Figure 4:
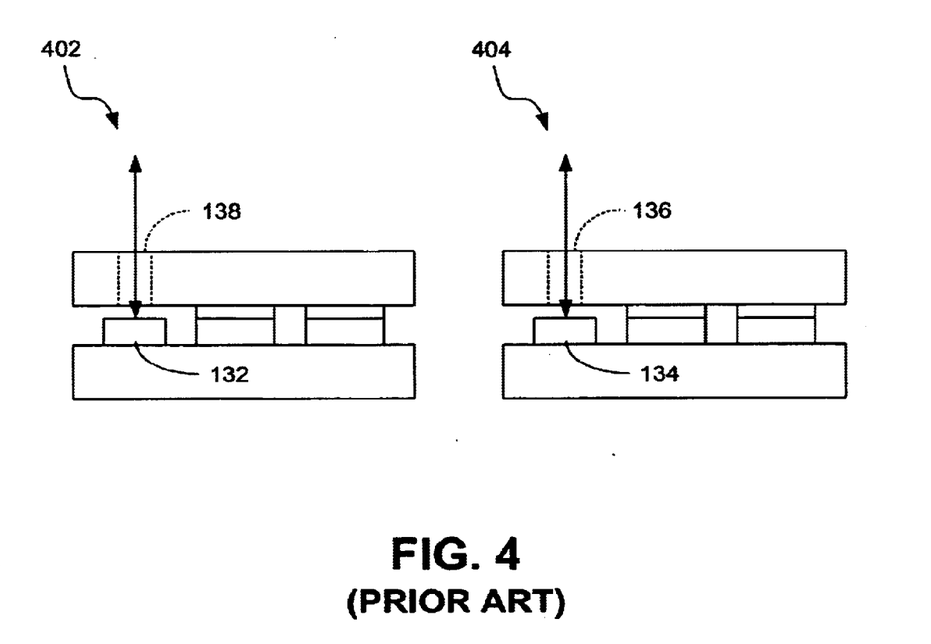
FIG. 4 is a schematic diagram depicting representative prior art die assemblies provided by the dicing technique of FIG. 3.

By dicing a wafer stack in the manner depicted in FIG. 3, separate die assemblies, such as die assemblies 402 and 404 (FIG. 4) can be provided. Also depicted in FIG. 4 is a typical configuration for providing signals on and/or off the die assembly. More specifically, a transmission medium (represented by an arrow) can be arranged through the via so that communication, e.g., electrical communication, optical communication, etc., may be facilitated between a pad of the die assembly and components external to the die assembly. However, due to design, manufacturing, performance, and/or assembly considerations, among others, providing one or more vias in a wafer stack and/or die assembly may not be desirable. Therefore, there is a need for improved systems and methods that address these and/or other shortcomings of the prior art.

SUMMARY OF THE INVENTION

Briefly described, the present invention relates to semiconductor fabrication. In this regard, embodiments of the invention may be construed as providing methods for dicing wafer stacks. In a preferred embodiment, the method includes the steps of: (1) providing a wafer stack having a first wafer and a second wafer; (2) exposing a portion of the first wafer by removing a portion of the second wafer; and (3) dicing the exposed portion of the first wafer such that a first die assembly is at least partially separated from the wafer stack.

Other embodiments of the invention may be construed as providing die assemblies. In a preferred embodiment, such a die assembly can be formed by the aforementioned method.

Still other embodiments of the invention may be construed as providing wafer stacks that define a plurality of die assemblies. A preferred wafer stack incorporates a first wafer that includes a first component, and a second wafer. The second wafer is arranged in an overlying relationship with the first wafer and is bonded to the first wafer. The second wafer defines a recessed portion. Preferably, the first component of the first wafer is arranged adjacent to the second wafer. The recessed portion is arranged in an overlying relationship with the first component and is configured to enable a partial through-cut of the second wafer to be performed in a vicinity of the recessed portion without significantly damaging the first component.

In another embodiment, the wafer stack includes a first wafer and a second wafer arranged in an overlying relationship with and bonded to the first wafer. The first wafer includes a first component, which is arranged adjacent to the second wafer. Preferably, the first and second wafers are configured to provide a gap that is arranged in an overlying relationship with the first component. The gap is configured to enable a partial through-cut of the second wafer in a vicinity of the gap so that the first component is not significantly damaged during formation of the partial through-cut.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION OF THE INVENTION

Figure 5:
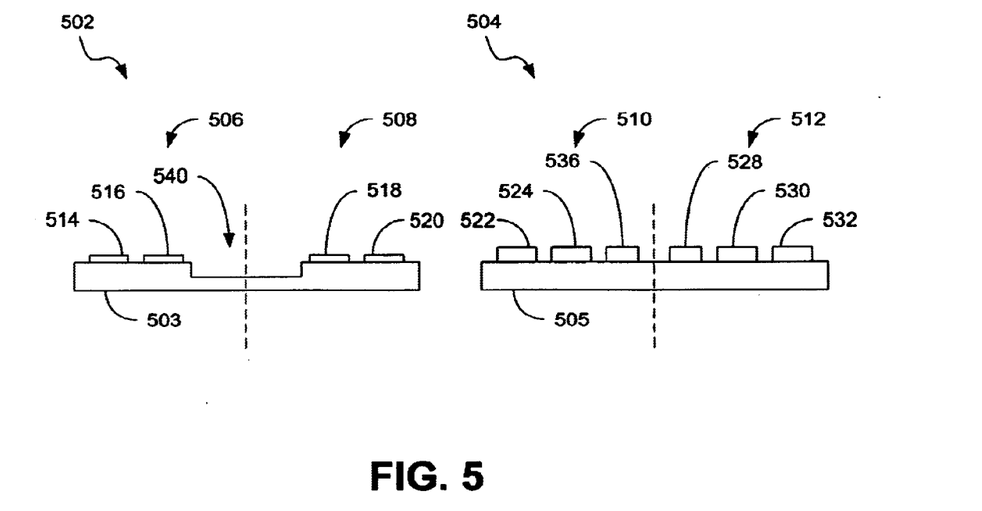
FIG. 5 is a schematic diagram of representative wafers incorporating a preferred embodiment of the dicing feature of the present invention.

Referring now to FIG. 5, representative portions of a first wafer 502 and a second wafer 504 are depicted. Each of the wafers is configured to provide one or more dies after a dicing procedure has been performed upon the wafers. In particular, wafer 502 includes dies 506 and 508, and wafer 504 includes dies 510 and 512. Each of the dies of the first wafer is adapted to engage a corresponding die of the second wafer. In particular, die 508 is adapted to engage die 510, and die 506 is adapted to engage die 512.

In FIG. 5, each of the wafers includes one or more features and/or components that are configured to engage one or more features and/or components of the other wafer. More specifically, die 506 includes components 514 and 516, die 508 includes components 518 and 520, die 510 includes components 522, 524, and 526, and die 512 includes components 528, 530, and 532. Components 526 and 528 can be configured to facilitate communication of signals to and/or from their respective dies.

In the embodiment of FIG. 5, wafer 502 defines a dicing street, i.e., a portion of the wafer that is configured to accommodate a partial through-cut of the wafer stack. As used herein, a "partial through-cut" refers to removing a portion of the material of the wafer stack without separating the wafer stack at the dicing location. Preferably, such a partial through-cut can be accomplished without damaging adjacent wafer components and/or material. In this regard, the dicing street of FIG. 5 is configured as a recessed portion 540. In other embodiments, the dicing street can be configured as a gap, which is defined by one or more recessed portions of one or more of the wafers of the wafer stack. The recessed portion(s) of such a gap cooperate to provide adequate spacing for facilitating a partial through-cut.

Removal of material to form a recessed portion may be accomplished by a suitable dicing or cutting procedure. For example, the recessed portion can be formed by a dicing blade, laser, and/or by aggressive etching.

Figure 6:
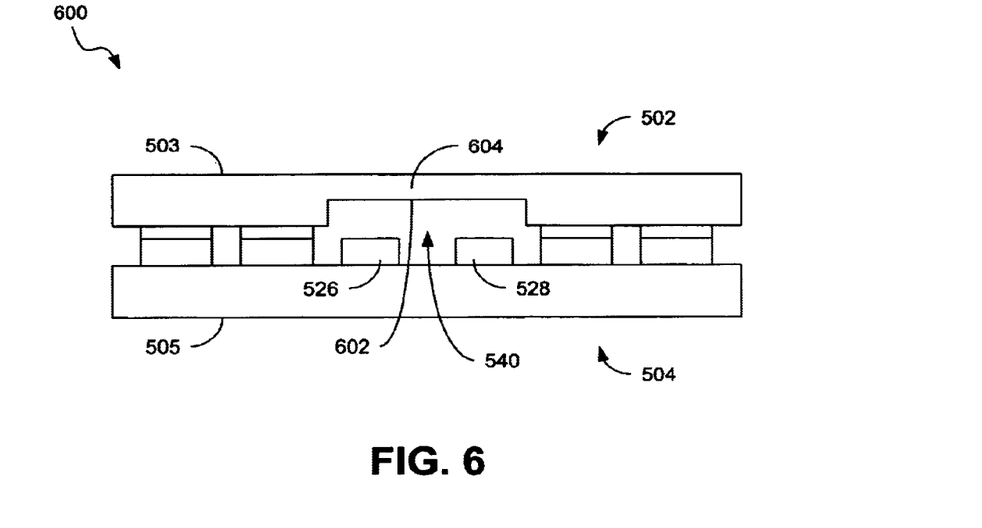
FIG. 6 is a schematic diagram depicting a wafer stack formed from the wafers of FIG. 5.

As depicted in FIG. 6, the various components of wafer 502 are adapted to engage and preferably electrically communicate with corresponding components of wafer 504. In particular, when wafer 502 is inverted, aligned with, and then engaged by wafer 504, component 520 engages component 522, component 518 engages component 524, component 516 engages component 530, and component 514 engages component 532. So engaged, wafers 502 and 504 form a wafer stack 600, with the various components of the wafers being at least partially disposed between the bulk 503, i.e., the non-component carrying portion, of wafer 502 and the bulk 505 of wafer 504. Also note that recess 540 is arranged in a generally overlying relationship with components 526 and 528.

In FIG. 6, recess 540 is defined, at least partially, by surface 602. When wafers 502 and 504 are appropriately mated, surface 602 preferably is adequately spaced from components 526 and 528 to permit removal of at least a portion of the material of wafer 502 associated with surface 602. In particular, at least a portion of the material can be removed by a dicing procedure, for example. The material to be removed is referred to herein as a "bridge," e.g., bridge 604.

In the embodiment depicted in FIG. 6, bridge 604 is formed primarily of bulk 503. In other embodiments, one or more material layers, components, and/or portions of layers and/or components may be included in the bridge.

Figure 7:
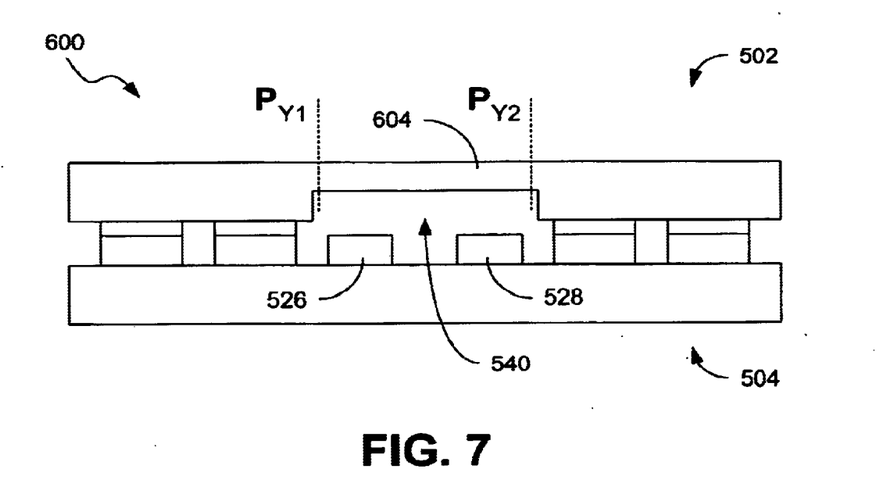
FIG. 7 is a schematic diagram of the wafer stack of FIG. 6 showing a portion of a preferred dicing technique of the present invention.
Figure 8:
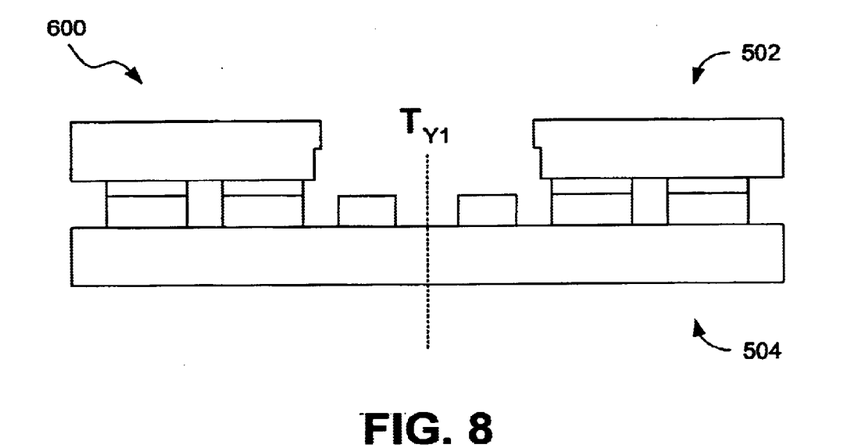
FIG. 8 is a schematic diagram depicting the wafer stack of FIG. 7 showing a subsequent portion of the dicing technique.
Figure 9:
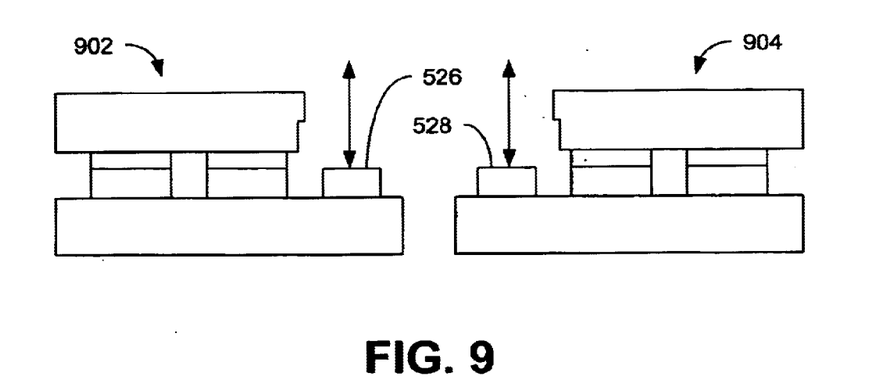
FIG. 9 is a schematic diagram depicting the wafer stack of FIG. 8 showing die assemblies resulting from the dicing technique.

A preferred dicing procedure or method of the present invention is depicted sequentially in FIGS. 7–9. In FIG. 7, dicing locations PY1 and PY2 are identified. These locations represent areas where bridge 604 is to be severed from the material of wafer 502. Removal of material along locations PY1 and PY2 may be accomplished by a suitable dicing or cutting procedure. For example, the locations can be diced by a dicing blade, laser, and/or aggressively etched so as to remove enough material to enable separation of the bridge from the wafer stack.

It should be noted that recessed portion 540 facilitates dicing of the material of bridge 604 and/or adjacent material of wafer 502 while permitting material removal to potentially be accomplished without damaging underlying materials and/or components. For example, surface 602 of the recessed portion may be sufficiently spaced from components 526 and 528 to permit penetration of a dicing blade (not shown) through the material of the bridge to a depth that enables separation of the bridge from the surrounding material. This can be accomplished while also providing a sufficient spacing between the blade and the components, e.g., components 526 and 528, so as not to damage the components.

After appropriate dicing, bridge 604 preferably is removed. Thereafter, such as depicted in FIG. 8, a through-cut may be made at dicing location TY1. Through-cut TY1 separates die assembly 902 from die assembly 904 (FIG. 9). So provided, components of a wafer stack, such as components 526 and 528, for example, can be accessed to facilitate communication of signals on and off the die assemblies. Representative transmission media are depicted schematically by arrows. Note that the configuration of the components 526 and 528 after dicing potentially provides increased design flexibility as greater access to these components is provided compared to die assembly configurations using vias, for example.

Figure 10:
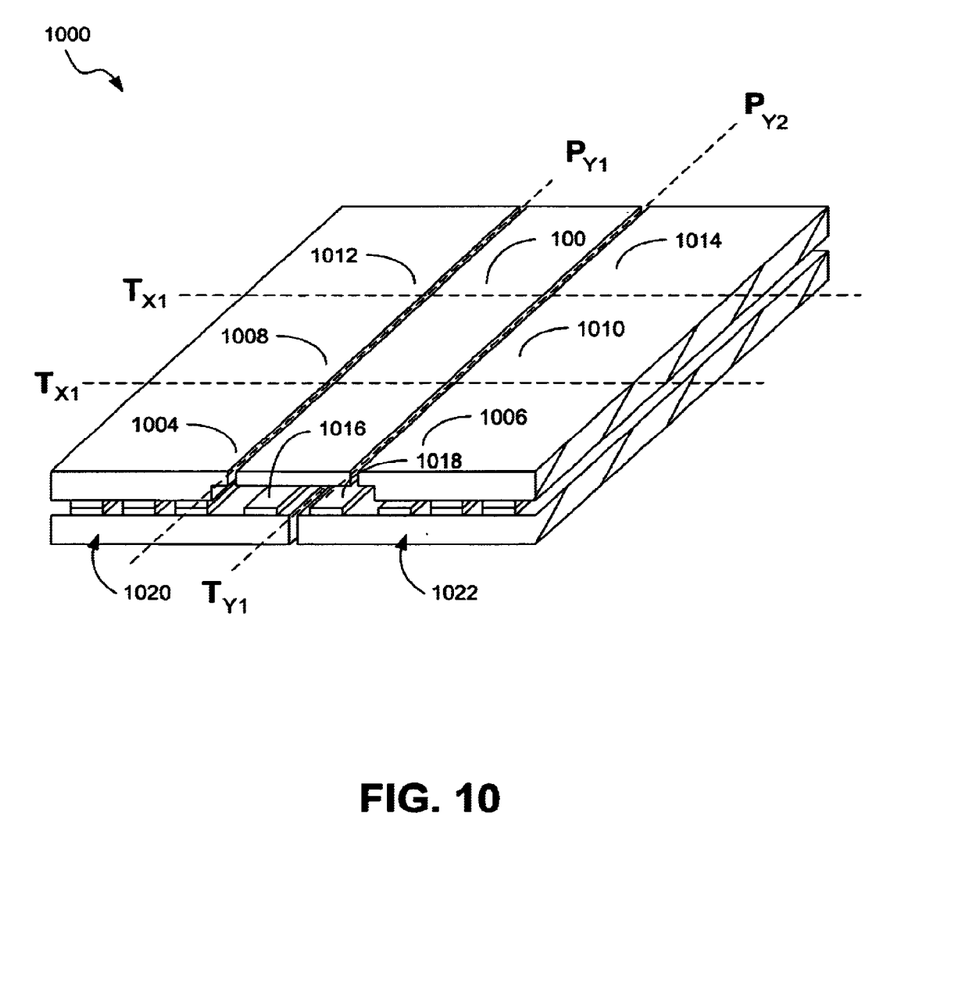
FIG. 10 is a schematic diagram depicting a representative portion of a wafer stack showing another dicing technique of the invention.

As depicted schematically in FIG. 10, multiple die assemblies can be provided on a wafer stack 1000, e.g., die assemblies 1004, 1006, 1008, 1010, 1012, and 1014. In FIG. 10, partial through-cuts PY1 and PY2 facilitate removal of a bridge 1002 that is associated with the die assemblies. Preferably, bridge 1002 is removed prior to performing through-cut TY1. Removal of the bridge exposes components of the die assemblies, such as components 1016 and 1018 of die assemblies 1004 and 1006, respectively, as well as exposing through-cut location TY1. Through-cut TY1 separates a first column 1020 of the die assemblies from a second column 1022. Through-cuts TX1 and TX2 also are associated with multiple die assemblies. In particular, through-cut TX1 separates die assembly 1008 from die assembly 1012 as well as die assembly 1010 from die assembly 1014, and through-cut TX2 separates die assembly 1004 from die assembly 1008 as well as die assembly 1006 from die assembly 1010.

Figure 11:
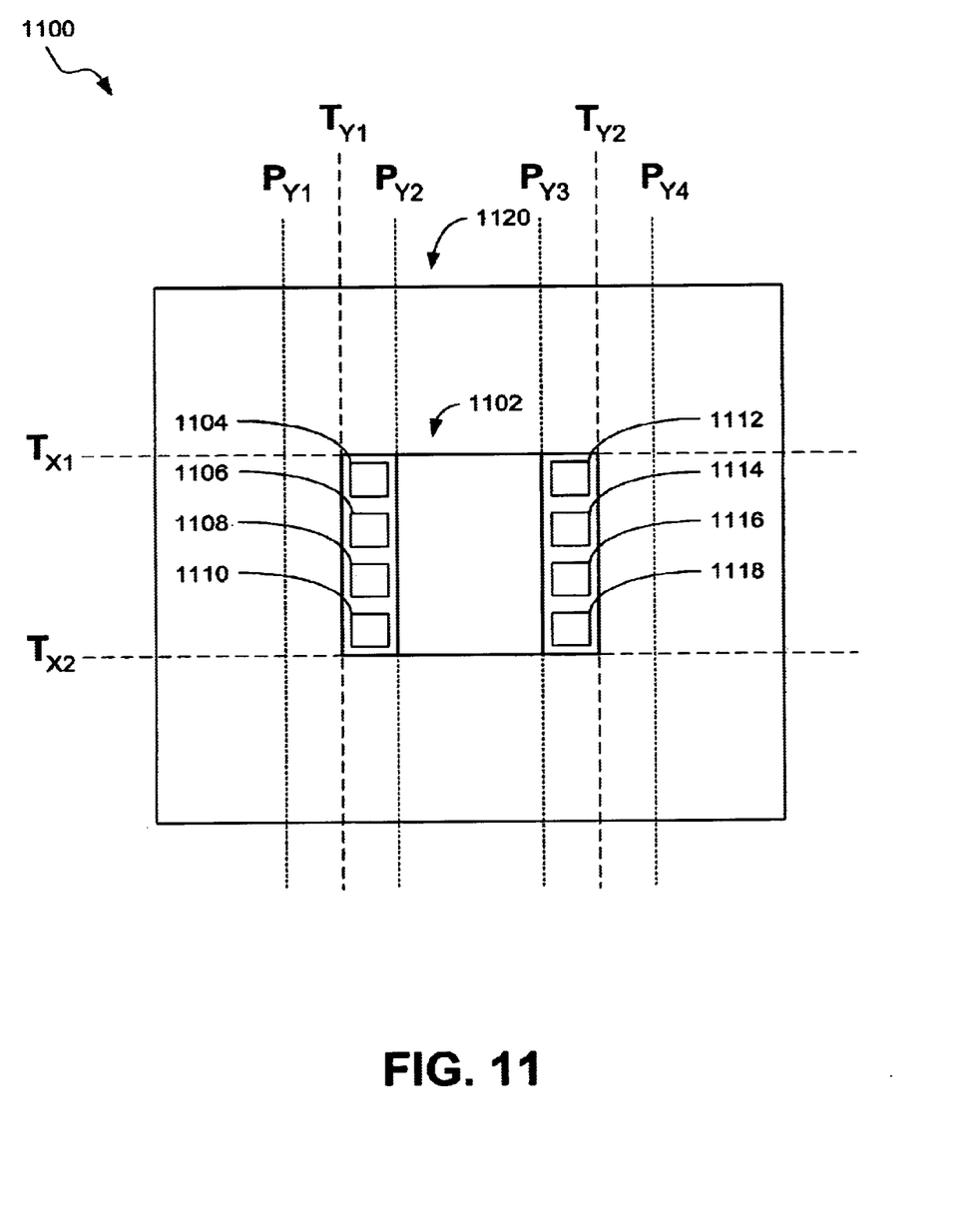
FIG. 11 is a schematic diagram depicting a representative portion of a wafer stack showing detail of still another dicing technique of the invention.

Clearly, dicing methods of the present invention may be applied to various die configurations. For example, a representative wafer stack 1100 (FIG. 11) includes a die assembly 1102. Die assembly 1102 incorporates multiple components, e.g., pads 1104, 1106, 1108, 1110, 1112, 1114, 1116, and 1118. The components are arranged on opposing sides of the die assembly and are to be exposed by dicing. In order to separate die assembly 1102 from the wafer stack, partial through-cuts PY1 and PY2 can be used to remove a first bridge (not shown) arranged in the vicinity of PY1 and PY2, and partial through-cuts PY3 and PY4 can be used to remove a second bridge (not shown) arranged in the vicinity of PY3 and PY4. Through-cuts TY1 and TY2 then can be used to separate the column 1120 of die assemblies in which the die assembly 1102 is arranged. Thereafter, through-cuts TX1 and TX2 can be used to separate die assembly 1102 from other die assemblies of that column. It should be noted that the various partial through-cuts and through-cuts can be made in an order other than that described so as to separate the die assembly from the wafer stack.

Figure 12:
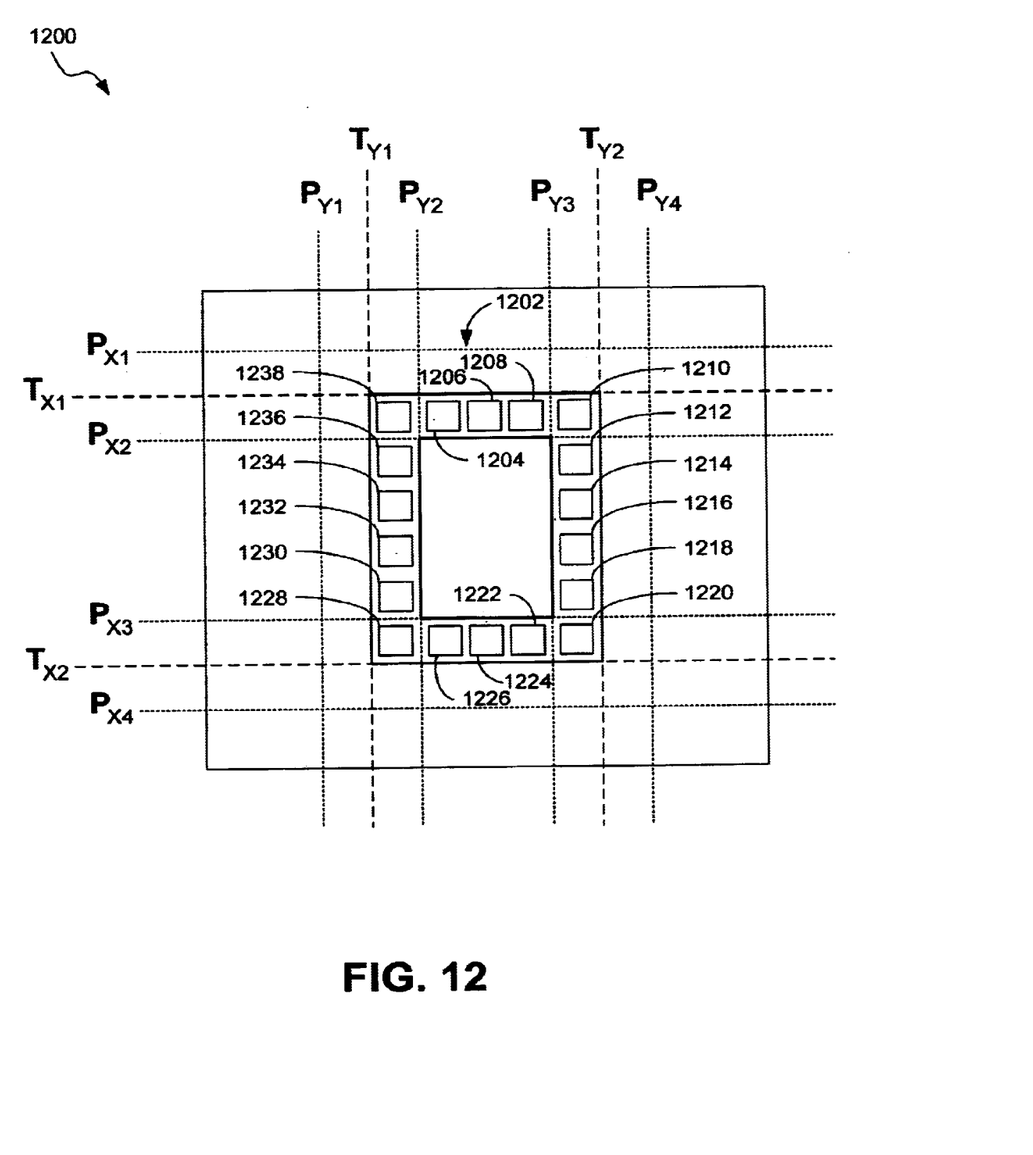
FIG. 12 is a schematic diagram of a representative wafer stack showing detail of yet another dicing technique of the invention.

In FIG. 12, an alternative dicing method is schematically depicted. The method in FIG. 12 may be suitable for use in separating a die assembly from a wafer stack when components are to be exposed about the periphery of the die assembly. In particular, FIG. 12 depicts a wafer stack 1200 that includes a die assembly 1202. Die assembly 1202 incorporates multiple pads, e.g., pads 1204–1238, about the periphery of the die assembly. In order to separate die assembly 1202 from wafer stack 1200, partial through-cuts PY1 through PY4 and PX1 through PX4 are made in order to remove the various material bridges (not shown) that at least partially obstruct access to the pads. Once so removed, through-cuts TY1, TY2, TX1 and TX2 can be provided. As mentioned hereinbefore, the various partial through-cuts and through-cuts in this, or any other representative example depicted and/or described, can be made in an order other than that depicted and/or described so as to separate a die assembly from a wafer stack.

Figure 13:
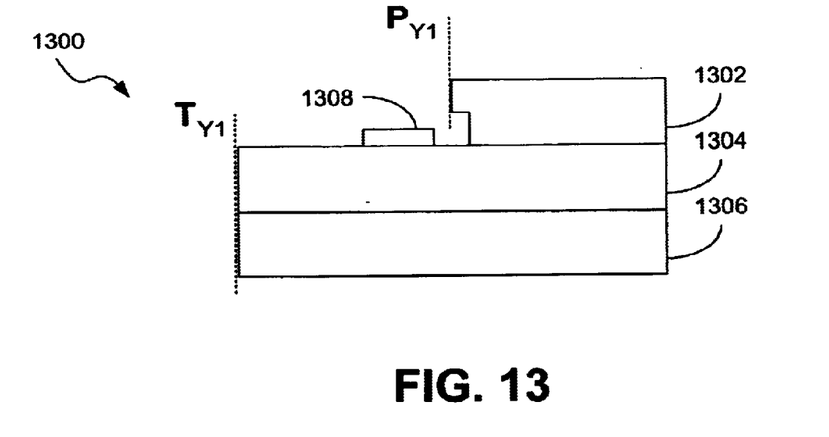
FIG. 13 is a schematic diagram depicting a representative portion of a die assembly produced by a dicing technique of the invention.

The dicing methodology of the invention also can be applied to a die assembly that includes more than two wafers. For example, a die assembly 1300 incorporating three wafers, e.g., wafers 1302, 1304 and 1306, is depicted in FIG. 13. In die assembly 1300, a component 1308 is exposed by partially through-cutting wafer 1302 (PY1). A through-cut TY1 then is made through wafers 1304 and 1306 to separate the die assembly from other material of an associated wafer stack.

Figure 14:
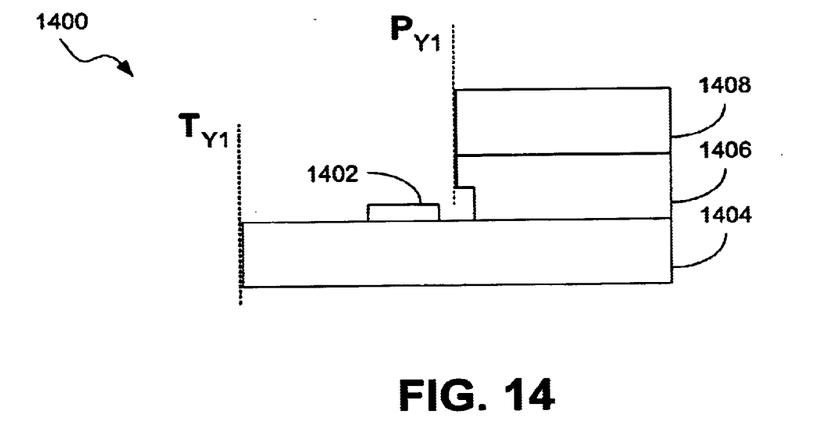
FIG. 14 is a schematic diagram depicting another representative portion of a die assembly produced by a dicing technique of the invention.

In FIG. 14, a multi-wafer die assembly 1400 is depicted. In this embodiment, however, component 1402 is provided on the bottommost wafer 1404. Thus, in order to expose component 1402, a partial through-cut PY1 is made through the material of wafers 1406 and 1408. A through-cut TY1 then is made through wafer 1402 to separate die assembly 1400 from other material of an associated wafer stack.

Figure 15:
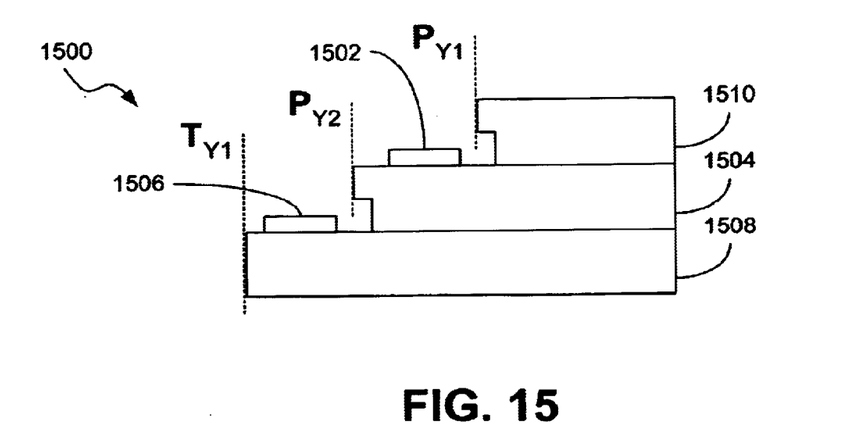
FIG. 15 is a schematic diagram depicting still another representative portion of a die assembly produced by a dicing technique of the invention.

In FIG. 15, a multi-wafer die assembly 1500 is depicted. In this embodiment, a component 1502 is provided on wafer 1504 and a component 1506 is provided on wafer 1508. In order to expose component 1502, a partial through-cut PY1 is made through the material of wafer 15010. This, in turn, enables a partial through-cut PY2 to be made through the material of wafer 1504. The combination of the first and second partial through-cuts permit through-cut TY1 to separate the die assembly. Various other configurations also may be utilized.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated.

For example, the various partial through-cuts and through-cuts in this, or any other representative example depicted an/or described herein, can be made in an order other than that depicted and/or described so as to separate a die assembly from a wafer stack. Additionally, various configurations of wafer stacks, die assemblies, dies, components and features can benefit from the methodologies of the present invention. All such modifications and variations, are within the scope of the invention as determined by the appended claims when interpreted in accordance with the breadth to which they are fairly and legally entitled.

What is claimed is:

1. A method for producing a die assembly comprising:
   providing a wafer stack having a first wafer and a second wafer arranged in an overlying relationship with each other, a first portion of the first wafer supporting a first component, a second portion of the first wafer supporting a second component, the first component and the second component being located between the first wafer and the second wafer;
   exposing the first portion and the second portion of the first wafer by removing a portion of the second wafer; and dicing the first wafer between the first component and the second component to form a first die assembly and a second die assembly, the first die assembly including the first portion of the first wafer that extends outwardly beyond the periphery of a first portion of the second wafer, and the second die assembly including the second portion of the first wafer that extends outwardly beyond the periphery of a second portion of the second wafer such that neither the first component nor the second component is located between the first wafer and the second wafer;

wherein the wafer stack includes a third wafer, the second wafer being arranged at least partially between the first wafer and the third wafer; and wherein exposing a portion of the first wafer comprises:

exposing the first portion and second portion of the first wafer by removing a portion of the third wafer and the portion of the second wafer.

2. The method of claim 1, wherein the first component is configured to electrically communicate with a component external to the wafer stack.

3. The method of claim 1, wherein dicing the first wafer between the first component and the second component comprises:

performing a through-cut of the wafer stack to at least partially detach the first die assembly from the wafer stack.

4. The method of claim 1, wherein exposing the first portion and the second portion of the first wafer comprises:

exposing a portion of the second wafer by removing a portion of the third wafer.

5. The method of claim 1:

wherein the first component is configured to electrically communicate with a component external to the wafer stack;

wherein the second wafer defines a recessed portion, the recessed portion being arranged in an overlying relationship with the first component, the recessed portion being configured to enable a partial through-cut of the second wafer in a vicinity of the recessed portion such that the first component is not damaged during formation of the partial through-cut; and wherein exposing the first portion and the second portion of the first wafer compnses:

performing a partial through-cut of the second wafer in the vicinity of the recessed portion such that the first component is not damaged by the partial through-cut.

6. The method of claim 5, wherein exposing the first portion and second portion of the first wafer comprises:

dicing the second wafer to enable detachment of the portion of the second wafer from the wafer stack; and removing the portion of the second wafer from the wafer stack.

7. The method of claim 6, wherein dicing the second wafer comprises:

performing a first partial through-cut and a second partial through-cut of the wafer stack to at least partially detach of a portion of the second wafer from the wafer stack, the portion of the second wafer to be detached being arranged between the first partial through-cut and the second partial through-cut.

* * * * *

UNITED STATES PATENT AND TRADEMARK OFFICE
CERTIFICATE OF CORRECTION

PATENT NO.        : 6,955,976 B2
APPLICATION NO.   : 10/066213
DATED             : October 18, 2005
INVENTOR(S)       : Peter G. Hartwell et al.

It is certified that error appears in the above-identified patent and that said Letters Patent is hereby corrected as shown below:

On the title page, item (54), in "Title", in column 1, line 1, delete "METHOD" and insert -- METHODS --, therefor.

In column 1, line 1, delete "METHOD" and insert -- METHODS --, therefor.

In column 8, line 14, in Claim 5, delete "compnses:" and insert -- comprises: --, therefor.

Signed and Sealed this

Sixteenth Day of March, 2010

David J. Kappos
*Director of the United States Patent and Trademark Office*